US008912027B2

(12) United States Patent
Ahn et al.

(10) Patent No.: US 8,912,027 B2
(45) Date of Patent: Dec. 16, 2014

(54) DISPLAY DEVICE AND METHOD OF MANUFACTURING THE SAME

(71) Applicant: Samsung Display Co., Ltd., Yongin, Gyeonggi-Do (KR)

(72) Inventors: Byung Du Ahn, Hwaseong-si (KR); Kyoung Won Lee, Ansan-si (KR); Gun Hee Kim, Hwaseong-si (KR); Young Joo Choi, Anyang-si (KR)

(73) Assignee: Samsung Display Co., Ltd (KR)

( * ) Notice: Subject to any disclaimer, the term of this patent is extended or adjusted under 35 U.S.C. 154(b) by 12 days.

(21) Appl. No.: 13/733,820

(22) Filed: Jan. 3, 2013

(65) Prior Publication Data

US 2014/0027759 A1     Jan. 30, 2014

(30) Foreign Application Priority Data

Jul. 24, 2012   (KR) ........................ 10-2012-0080796

(51) Int. Cl.
*H01L 33/44*   (2010.01)
*H01L 29/786*   (2006.01)
*H01L 27/12*   (2006.01)

(52) U.S. Cl.
CPC ............ *H01L 33/44* (2013.01); *H01L 29/7869* (2013.01); *H01L 27/1225* (2013.01)
USPC .. 438/38; 257/43; 257/E29.296; 257/E21.411

(58) Field of Classification Search
CPC ....... H01L 21/00; H01L 21/16; H01L 21/479; H01L 21/02178; H01L 33/44
USPC ................ 257/43, E29.296, E21.411; 438/38
See application file for complete search history.

(56) References Cited

U.S. PATENT DOCUMENTS

| 6,563,174 | B2 | 5/2003 | Kawasaki et al. |
| 6,727,522 | B1 | 4/2004 | Kawasaki et al. |
| 6,878,962 | B1 | 4/2005 | Kawasaki et al. |
| 7,067,843 | B2 | 6/2006 | Carcia et al. |
| 7,145,174 | B2 | 12/2006 | Chiang et al. |
| 7,189,992 | B2 | 3/2007 | Wager, III et al. |
| 7,211,825 | B2 | 5/2007 | Shih et al |

(Continued)

FOREIGN PATENT DOCUMENTS

| JP | 05-251705 A | 9/1993 |
| JP | 4164562 B2 | 8/2008 |

(Continued)

*Primary Examiner* — Matthew W Such
*Assistant Examiner* — Monica D Harrison
(74) *Attorney, Agent, or Firm* — Innovation Counsel LLP

(57) ABSTRACT

A display device according to an exemplary embodiment of the present invention includes a semiconductor layer; a data line disposed on the semiconductor layer, and a source electrode as well as a drain electrode disposed on the semiconductor layer and facing the source electrode. The semiconductor layer is made of an oxide semiconductor including indium, tin, and zinc. An atomic percent of indium in the oxide semiconductor is equal to or larger than about 10 at % and equal to or smaller than about 90 at %, an atomic percent of zinc in the oxide semiconductor is equal to or larger than about 5 at % and equal to or smaller than about 60 at %, and an atomic percent of tin in the oxide semiconductor is equal to or larger than about 5 at % and equal to or smaller than about 45 at %, and the data line and the drain electrode comprise copper.

17 Claims, 13 Drawing Sheets

(56) References Cited

U.S. PATENT DOCUMENTS

| | | |
|---|---|---|
| 7,242,039 B2 | 7/2007 | Hoffman et al. |
| 7,262,463 B2 | 8/2007 | Hoffman et al. |
| 7,297,977 B2 | 11/2007 | Hoffman et al. |
| 7,339,187 B2 | 3/2008 | Wager, III et al. |
| 7,382,421 B2 | 6/2008 | Hoffman et al. |
| 7,453,087 B2 | 11/2008 | Iwasaki |
| 7,601,984 B2 | 10/2009 | Sano et al. |
| 2008/0017862 A1* | 1/2008 | Lee et al. ............ 257/59 |
| 2008/0128689 A1 | 6/2008 | Lee et al. |
| 2008/0254569 A1 | 10/2008 | Hoffman et al. |
| 2009/0072232 A1 | 3/2009 | Hayashi et al. |
| 2009/0278120 A1 | 11/2009 | Lee et al. |
| 2010/0044703 A1 | 2/2010 | Yabuta et al. |
| 2010/0051934 A1* | 3/2010 | Choung et al. .......... 257/43 |
| 2010/0059746 A1 | 3/2010 | Itai |
| 2010/0155716 A1 | 6/2010 | Cheong et al. |
| 2010/0163868 A1 | 7/2010 | Yamazaki et al. |
| 2010/0276686 A1 | 11/2010 | Lee et al. |
| 2011/0006302 A1 | 1/2011 | Yamazaki et al. |
| 2011/0042666 A1 | 2/2011 | Yang et al. |
| 2011/0068337 A1 | 3/2011 | Choi et al. |
| 2011/0109532 A1 | 5/2011 | Choi |
| 2011/0140097 A1 | 6/2011 | Cheong et al. |
| 2011/0193076 A1 | 8/2011 | Yun et al. |
| 2011/0240987 A1 | 10/2011 | Lee et al. |
| 2013/0181212 A1* | 7/2013 | Kim et al. ............ 257/43 |

FOREIGN PATENT DOCUMENTS

| | | |
|---|---|---|
| JP | 4170454 B2 | 8/2008 |
| JP | 2009-141001 A | 6/2009 |
| JP | 2009-141002 A | 6/2009 |
| JP | 2010-067710 A | 3/2010 |
| JP | 2010-067954 A | 3/2010 |
| KR | 100490924 B1 | 5/2005 |
| KR | 1020070104549 A | 10/2007 |
| KR | 1020080052107 A | 6/2008 |
| KR | 1020080095540 A | 10/2008 |
| KR | 100889796 B1 | 3/2009 |
| KR | 100911698 B1 | 8/2009 |
| KR | 1020090089444 A | 8/2009 |
| KR | 1020090089450 A | 8/2009 |
| KR | 100925210 B1 | 11/2009 |
| KR | 1020090122815 A | 12/2009 |
| KR | 100939998 B1 | 1/2010 |
| KR | 1020100002899 A | 1/2010 |
| WO | 03040441 A1 | 5/2003 |

\* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2012-0080796 filed in the Korean Intellectual Property Office on Jul. 24, 2012, the entire contents of which are incorporated herein by reference.

BACKGROUND OF THE INVENTION (a) Field of the Invention

Embodiments of the present invention relate generally to flat panel displays. More specifically, embodiments of the present invention relate to a flat panel display device using an oxide semiconductor and a method of manufacturing the same.

(b) Description of the Related Art

In general, a thin film transistor (TFT) is used as a switching element for independently driving each pixel in a flat panel display such as a liquid crystal display, an organic light emitting display or the like. A thin film display panel including such a thin film transistor typically includes a gate line for transferring a gate signal to the thin film transistor, a data line for transferring signals such as data signals, and a pixel electrode connected to the thin film transistor.

The thin film transistor also typically includes a gate electrode connected to the gate line, a source electrode connected to the data line, a drain electrode connected to a pixel electrode, and a semiconductor layer disposed on the gate electrode between the source electrode and the drain electrode. In this manner, the TFT transfers the data signal from the data line to the pixel electrode according to the gate signal from the gate line.

The semiconductor is an important factor for determining characteristics of the thin film transistor. Amorphous silicon is mainly used for the semiconductor, but has limitations in manufacturing high performance thin film transistors since amorphous silicon has low charge mobility. Further, when polysilicon is used, it is easier to manufacture high performance thin film transistors due to high charge mobility. However, there is a limitation in manufacturing large thin film transistor display panels due to higher cost and lower uniformity.

Accordingly, research is currently being conducted on thin film transistors using oxide semiconductors having higher electron mobility and a higher on/off rate of current than amorphous silicon, and having lower cost and higher uniformity than the polysilicon.

In particular, some of this research focuses on using zinc oxide (ZnO), tin oxide ($SnO_2$), zinc-tin oxide (ZnSnO) and the like for the oxide semiconductor. However, since characteristics of thin film transistor and their etching characteristics may vary depending on the composition of component materials forming the oxide semiconductor, the manufacture of display devices using oxide semiconductors faces challenges.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a display device capable of preventing or reducing the loss of a channel part of an oxide semiconductor when a metal wiring is etched.

An exemplary embodiment of the present invention provides a display device including: a first substrate; a gate line disposed on the first substrate, and including a gate electrode; a gate insulating layer disposed on the gate line; a semiconductor layer disposed on the gate insulating layer; a data line disposed on the semiconductor layer and including a source electrode; a drain electrode disposed on the semiconductor layer, and facing the source electrode; and a passivation layer disposed on the data line and the drain electrode. The semiconductor layer comprises an oxide semiconductor including indium, tin, and zinc. An atomic percent of the indium in the oxide semiconductor is equal to or larger than about 10 at % and equal to or smaller than about 90 at %, an atomic percent of the zinc in the oxide semiconductor is equal to or larger than about 5 at % and equal to or smaller than about 60 at %, and an atomic percent of the tin in the oxide semiconductor is equal to or larger than about 5 at % and equal to or smaller than about 45 at %, and the data line and the drain electrode comprise copper.

A minimum etch selective ratio between the oxide semiconductor, and the data line and the drain electrode may satisfy:

$$-0.22+0.002 \times T,$$

where T denotes a thickness of the data line and the drain electrode.

The gate insulating layer may include a first insulating layer and a second insulating layer disposed on the first insulating layer. The first insulating layer may include silicon nitride, and the second insulating layer may include silicon oxide.

The passivation layer may include a first passivation layer and a second passivation layer disposed on the first passivation layer, the first passivation layer may include silicon oxide, and the second passivation layer may include silicon nitride.

The display device may further include a pixel electrode disposed on the passivation layer, wherein the passivation layer may have a contact hole, and the pixel electrode and the drain electrode may be connected through the contact hole.

The display device may further include a second substrate facing the first substrate, wherein a liquid crystal layer may be interposed between the first substrate and the second substrate.

Another exemplary embodiment of the present invention provides a display device including: a first substrate; a gate line disposed on the first substrate and including a gate electrode; a gate insulating layer disposed on the gate line; a semiconductor layer disposed on the gate insulating layer; a data line disposed on the semiconductor layer and including a source electrode; a drain electrode disposed on the semiconductor layer and facing the source electrode; and a passivation layer disposed on the data line and the drain electrode. The semiconductor layer comprises an oxide semiconductor including indium, tin, and zinc. An atomic percent of the indium in the oxide semiconductor is equal to or larger than about 10 at % and equal to or smaller than about 80 at %, an atomic percent of the zinc in the oxide semiconductor is equal to or larger than about 10 at % and equal to or smaller than about 70 at %, and an atomic percent of the tin in the oxide semiconductor is equal to or larger than about 5 at % and equal to or smaller than about 45 at %. The data line and the drain electrode include a lower layer and an upper layer comprising molybdenum, and an intermediate layer comprising aluminum, where the intermediate layer is disposed between the lower layer and the upper layer.

Yet another exemplary embodiment of the present invention provides a method of manufacturing a display device, the method including: forming a gate line on a first substrate, the gate line including a gate electrode; forming a gate insulating layer on the gate line; forming a semiconductor layer by depositing an oxide semiconductor material including indium, tin, and zinc on the gate insulating layer and then etching the oxide semiconductor material with a first etchant; forming a data line including a source electrode and a drain electrode facing the source electrode, by forming a metal layer on the semiconductor layer and then etching the metal layer with a second etchant; and forming a passivation layer on the data line and the drain electrode.

The first etchant and the second etchant may be copper etchants.

An atomic percent of the indium in the oxide semiconductor material may be equal to or larger than about 10 at % and equal to or smaller than about 90 at %, an atomic percent of the zinc in the oxide semiconductor material may be equal to or larger than about 5 at % and equal to or smaller than about 60 at %, and an atomic percent of the tin in the oxide semiconductor material may be equal to or larger than about 5 at % and equal to or smaller than about 45 at %.

The metal layer may comprise copper.

A minimum etch selective ratio between the oxide semiconductor material and the metal layer may satisfy:

$$-0.22+0.002 \times T$$

where T denotes a thickness of the metal layer.

The first etchant may be a copper etchant, and the second etchant may be a combination etchant.

An atomic percent of the indium in the oxide semiconductor material may be equal to or larger than about 10 at % and equal to or smaller than about 80 at %, an atomic percent of the zinc in the oxide semiconductor material may be equal to or larger than about 10 at % and equal to or smaller than about 70 at %, and an atomic percent of the tin in the oxide semiconductor material may be equal to or larger than about 5 at % and equal to or smaller than about 45 at %.

The metal layer may include a lower layer, an upper layer comprising molybdenum, and an intermediate layer comprising aluminum and disposed between the lower layer and the upper layer.

According to an embodiment of the present invention, it is possible to prevent or reduce the loss of a channel part of an oxide semiconductor when a metal wiring is etched by using an oxide semiconductor including indium, zinc, and tin, and controlling atomic concentration ratios of indium, zinc, and tin.

DETAILED DESCRIPTION OF THE EMBODIMENTS

Figure 1:
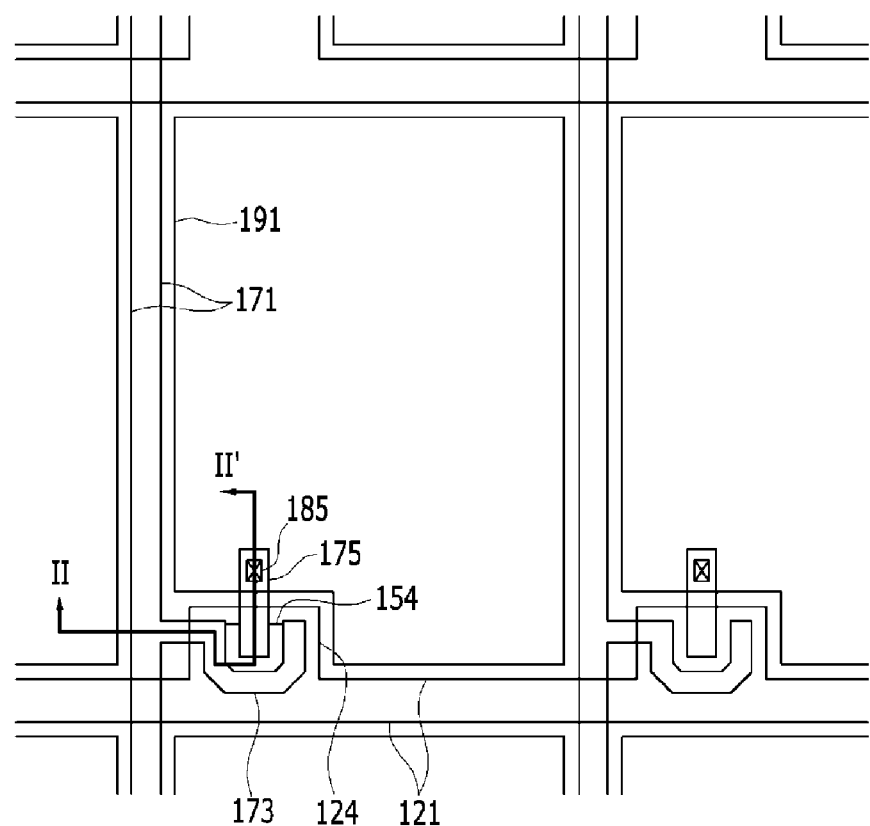
FIG. 1 is a layout view illustrating a thin film transistor display panel according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

Figure 2:
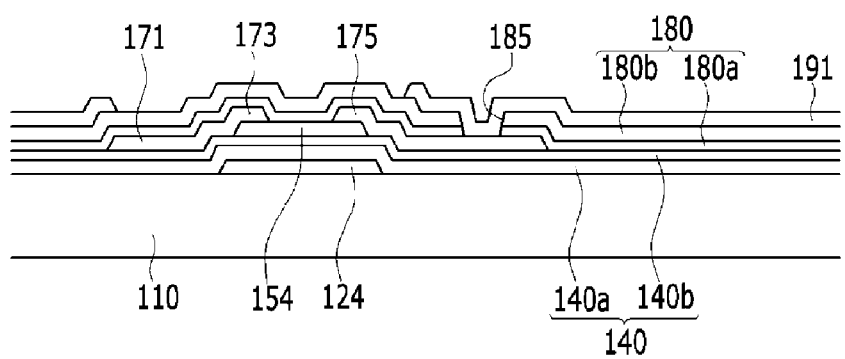
FIG. 2 is a cross-sectional view taken along the line II-II' of FIG. 1.

FIG. 1 is a layout view illustrating a thin film transistor display panel for a display device according to an exemplary embodiment of the present invention. FIG. 2 is a cross-sectional view taken along the line II-II' of FIG. 1.

Referring to FIGS. 1 and 2, a plurality of gate lines 121 are formed on a first substrate 110 made of a transparent glass or plastic.

The gate line 121 transfers gate signals, and extends substantially in a horizontal direction. Each gate line 121 includes a plurality of gate electrodes 124 protruding from the gate line 121.

The gate line 121 and the gate electrode 124 may be made of a material selected from an aluminum based metal such as aluminum (Al), an aluminum alloy and the like, a silver based metal such as silver (Ag), a silver alloy and the like, and a copper based metal such as copper (Cu), a copper alloy and the like.

Although it is described that the gate line 121 and the gate electrode 124 are formed as a single layer in the present exemplary embodiment, the gate line 121 and the gate electrode 124 are not limited thereto and may be formed in a dual-layer or a triple-layer configuration.

When the gate line 121 and the gate electrode 124 have a dual-layer structure, the gate line 121 and gate electrode 124 may be formed of a lower layer and an upper layer, and the lower layer may be made of one selected from a molybdenum based metal such as molybdenum (Mo), a molybdenum alloy and the like, chromium (Cr), a chromium alloy, titanium (Ti), a titanium alloy, tantalum (Ta), a tantalum alloy, manganese (Mn), and a manganese alloy. The upper layer may be made of one selected from an aluminum based metal such as aluminum (Al), an aluminum alloy and the like, a silver based metal such as silver (Ag), a silver alloy and the like, and a copper based metal such as copper (Cu), a copper alloy and the like. When the gate line 121 and the gate electrode 124 have a triple-layer structure, the gate line 121 and the gate electrode 124 may be formed by combining layers having different physical characteristics.

A gate insulating layer 140 is formed on the gate line 121. The gate insulating layer 140 may include a first insulating layer 140a and a second insulating layer 140b disposed on the first insulating layer 140a. The first insulating layer 140a may be formed of silicon nitride ($SiN_x$) having an approximate thickness of 4000 Å, and the second insulating layer 140b may be formed of silicon oxide ($SiO_2$) having a thickness of approximately 500 Å. As another exemplary embodiment, the first insulating layer 140a may be formed of silicon oxynitride (SiON), and the second insulating layer 140b may be formed of silicon oxide ($SiO_2$). Although it is described that the gate insulating layer 140 is formed as two layers in the present exemplary embodiment, the gate insulating layer 140 may also be formed of a single layer.

A plurality of semiconductors 154 made of oxide semiconductor is formed on gate insulating layer 140.

The oxide semiconductor according to the present exemplary embodiment includes indium (In), zinc (Zn), and tin (Sn). An atomic percent of indium constituting the oxide semiconductor is equal to or larger than about 10 at % and equal to or smaller than about 90 at %, an atomic percent of zinc is equal to or larger than about 5 at % and equal to or smaller than about 60 at %, and an atomic percent of tin is equal to or larger than about 5 at % and equal to or smaller than about 45 at %.

Further, a minimum etching selection ratio between the oxide semiconductor according to the present exemplary embodiment and the data line 171 and the drain electrode 175 can be determined according to Equation (1) when the data line 171 and drain electrode 175 are formed of a copper based metal.

$$\text{Minimum etching selection ratio} = -0.22 + 0.002 \times T \quad \text{Equation (1)}$$

In Equation (1), T denotes a thickness of the data line and the drain electrode.

Further, resistivity of the oxide semiconductor according to the present exemplary embodiment is equal to or smaller than about $5 \times 10^{-2}$ [Ωcm]. The resistivity corresponds to a range for applying an oxide semiconductor target including indium, zinc, and tin using an AC sputter or a DC sputter from a viewpoint of mass production.

A plurality of data lines 171 (connected to the plurality of respective source electrodes 173) and a plurality of drain electrodes 175 are formed on the semiconductor layer 154.

The data line 171 transfers data signals, and extends substantially in a vertical direction to cross the gate line 121. Each data line 171 extends toward the gate electrode 124 to be connected with the plurality of source electrodes 173. Here, the source electrodes 173 generally have a U shape, although any shape is contemplated.

The drain electrode 175 is separated from the data line 171, and extends upwardly from a center of the U shape of the source electrode 173. Such shapes of the source electrode 173 and the drain electrode 175 are only one example, and various modifications may be made thereto.

The data line 171, the source electrode 173 and drain electrode 175 are made of a copper based metal such as copper (Cu), a copper alloy or the like.

The semiconductor layer 154 has an exposed part between the source electrode 173 and the drain electrode 175, which is not covered by either the data line 171 or the drain electrode 175.

One gate electrode 124, one source electrode 173 and one drain electrode 175 collectively form one thin film transistor (TFT) together with the semiconductor layer 154, and a channel of the thin film transistor is formed on the semiconductor layer 154 between the source electrode 173 and the drain electrode 175. At this time, a thickness of the semiconductor layer 154 corresponding to a part of the channel of the thin film transistor is equal to or thicker than about 200 Å. When the thickness of the channel of the thin film transistor is thinner than about 200 Å, characteristics of the thin film transistor deteriorate.

A passivation layer 180 is formed on the data line 171, the drain electrode 175 and the exposed part of the semiconductor layer 154. The passivation layer 180 may include a first passivation layer 180a and a second passivation layer 180b disposed on the first passivation layer 180a. The first passivation layer 180a may be formed of silicon oxide ($SiO_2$) having an approximate thickness of 500 Å, and the second passivation layer 180b may be formed of silicon nitride ($SiN_x$) having an approximate thickness of 1000 Å.

In another exemplary embodiment, the first passivation layer 180a may be formed of silicon oxide ($SiO_2$), and the second passivation layer 180b may be formed of silicon oxynitride (SiON). Although it is described that the passivation layer 180 is formed in a dual-layer type configuration in the present exemplary embodiment, the passivation layer 180 may be formed in a single-layer type configuration.

A plurality of pixel electrodes 191 are formed on the passivation layer 180. The pixel electrode 191 is physically and electrically connected with the drain electrode 175 through a contact hole 185, and receives a data voltage from the drain electrode 175.

The above embodiment described a thin film transistor display panel for the display device, in which the transistor has a semiconductor layer formed of an oxide semiconductor including indium, zinc, and tin. Hereinafter, a liquid crystal display including a thin film transistor display panel 100 according to the present exemplary embodiment will be described as an example with reference to FIG. 3.

Figure 3:
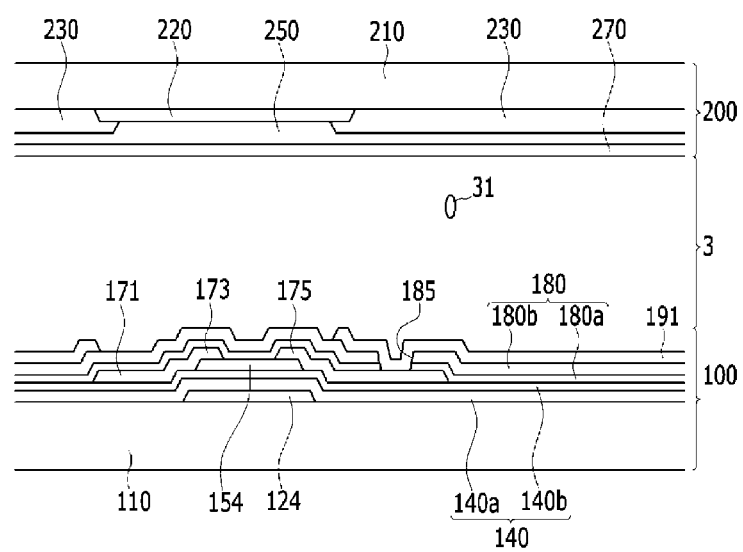
FIG. 3 is a cross-sectional view illustrating a liquid crystal display according to another exemplary embodiment of the present invention

FIG. 3 is a cross-sectional view illustrating a liquid crystal display according to another exemplary embodiment of the present invention.

Referring to FIG. 3, the liquid crystal display according to the present exemplary embodiment includes a first display panel 100, a second display panel 200 and a liquid crystal layer 3 disposed between the two display panels 100 and 200.

The first display panel 100 has the same construction as that of the thin film transistor display panel of FIG. 2.

A second substrate 210 is disposed in a position facing the first substrate 110. The second substrate 210 may be an insulation substrate made of a transparent glass, plastic or the like. A light blocking member 220 is formed on the second substrate 210. The light blocking member 220 is also referred to as a black matrix, and prevents light leakage.

Also, a plurality of color filters 230 are formed on the second substrate 210 and the light blocking member 220. Most color filters 230 exist within an area surrounded by the light blocking member 220, and may extend along a row of the pixel electrodes 191. Each color filter 230 may express one of primary colors such as the three primary colors including red, green and blue. However, each color filter 230 is not limited to the three primary colors including red, green and blue, and may for example express one of cyan, magenta, yellow, and white.

At least one of the light blocking member 220 and the color filter 230 may be formed on the first display panel 100.

An overcoat 250 is formed on the color filter 230 and the light blocking member 220. The overcoat 250 may be formed of an insulating material, can prevent the color filter 230 from being exposed, and also provide a flat surface. The overcoat 250 may be omitted.

A common electrode 270 is formed on the overcoat 250.

The pixel electrode 191 to which the data voltage is applied generates an electric field together with the common electrode 270 receiving a common voltage, so as to determine a direction of a liquid crystal molecule 31 of the liquid crystal layer 3 between the two electrodes. The pixel electrode 191 and the common electrode 270 together form a capacitor to maintain the applied voltage after the thin film transistor is turned off.

The pixel electrode 191 may also form a storage capacitor by overlapping a storage electrode line (not shown), and accordingly improve a voltage maintenance capability of a liquid crystal capacitor.

The pixel electrode 191 may be made of a transparent conductor such as ITO or IZO.

Although it has been described that the thin film transistor display panel according to the present exemplary embodiment is used in a liquid crystal display, the present exemplary embodiment may be widely applied to an organic light emitting device and other display devices for performing a switching operation by using the thin film transistor.

A method of manufacturing a thin film transistor display panel for a display device according to an exemplary embodiment of the present invention will now be described with reference to FIGS. 4 to 7 together with FIG. 2.

FIGS. 4 to 7 are cross-sectional views sequentially illustrating a method of manufacturing a thin film transistor display panel for a display device according to an exemplary embodiment of the present invention.

Figure 4:
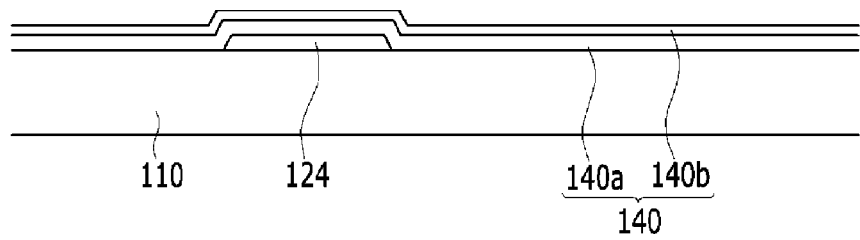
FIGS. 4 to 7 are cross-sectional views sequentially illustrating a method of manufacturing a thin film transistor display panel for a display device according to an exemplary embodiment of the present invention.

First, as illustrated in FIG. 4, after the gate line (not shown) including the gate electrode 124 is formed on the transparent first substrate 110, the gate insulating layer 140 is formed by sequentially depositing the first insulating layer 140a and the second insulating layer 140b on an entire surface of the first substrate 110 including the gate line (not shown).

Figure 5:
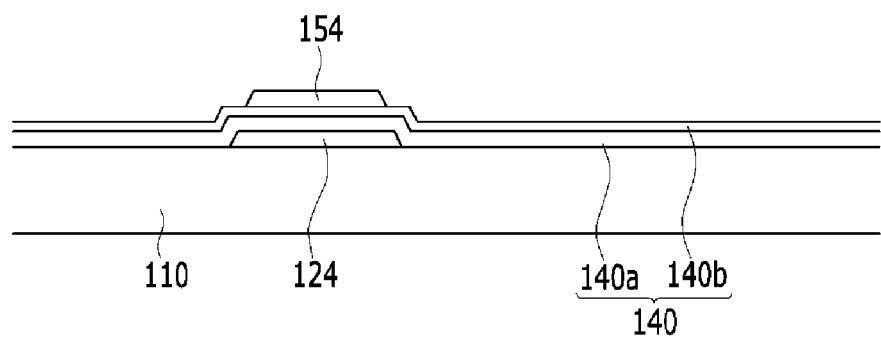

Subsequently, as illustrated in FIG. 5, the semiconductor layer 154 is formed on a part of the gate insulating layer 140 corresponding to the gate electrode 124.

The semiconductor layer 154 is formed by forming an oxide semiconductor material on the gate insulating layer 140 and then etching the oxide semiconductor material. Any suitable etching process is contemplated. For example, wet etching using copper etchant can be used.

An atomic percent of indium constituting the oxide semiconductor material is equal to or larger than about 10 at % and equal to or smaller than about 90 at %, an atomic percent of zinc is equal to or larger than about 5 at % and equal to or smaller than about 60 at %, and an atomic percent of tin is equal to or larger than about 5 at % and equal to or smaller than about 45 at %. The atomic percents of indium, zinc and tin allow the thickness of the semiconductor layer 154 of the channel part of the thin film transistor to be about 200 Å or more when the copper based metal layer is etched by copper etchant.

Figure 6:
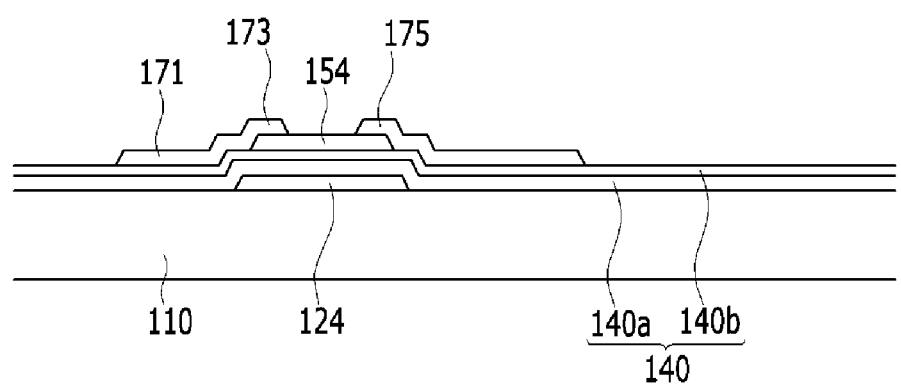

Subsequently, as illustrated in FIG. 6, the data line 171, including the source electrode 173 and the drain electrode 175 facing the source electrode 173, are formed on the semiconductor layer 154 and the gate insulating layer 140. The data line 171 and the drain electrode 175 are formed by forming a copper based metal layer (not shown) such as copper, a copper alloy or the like on the semiconductor layer 154 and the gate insulating layer 140 and then wet-etching with a copper etchant.

Figure 7:
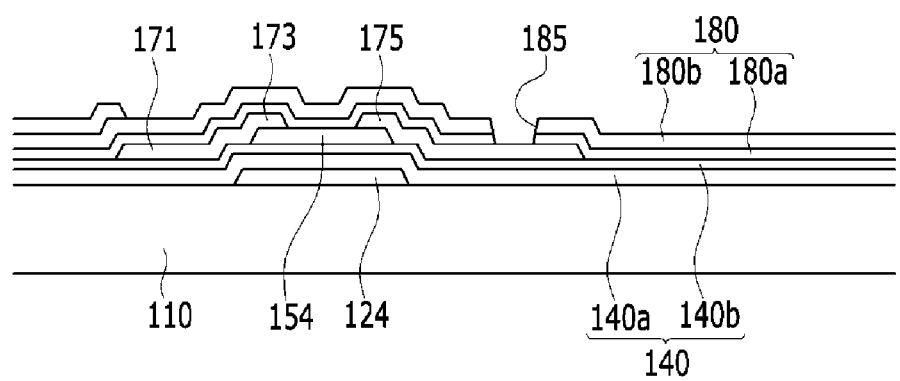

Subsequently, the passivation layer 180 is formed by sequentially depositing the first passivation layer 180a and the second passivation layer 180b on an entire surface including the data line 171, the drain electrode 175 and the gate insulating layer 140 as illustrated in FIG. 7. Next, the contact hole 185 for exposing the drain electrode 175 is formed and the pixel electrode 191 is formed on the passivation layer 180 as illustrated in FIG. 2.

Hereinafter, the semiconductor layer according to the present exemplary embodiment will be described in detail.

Figure 8:
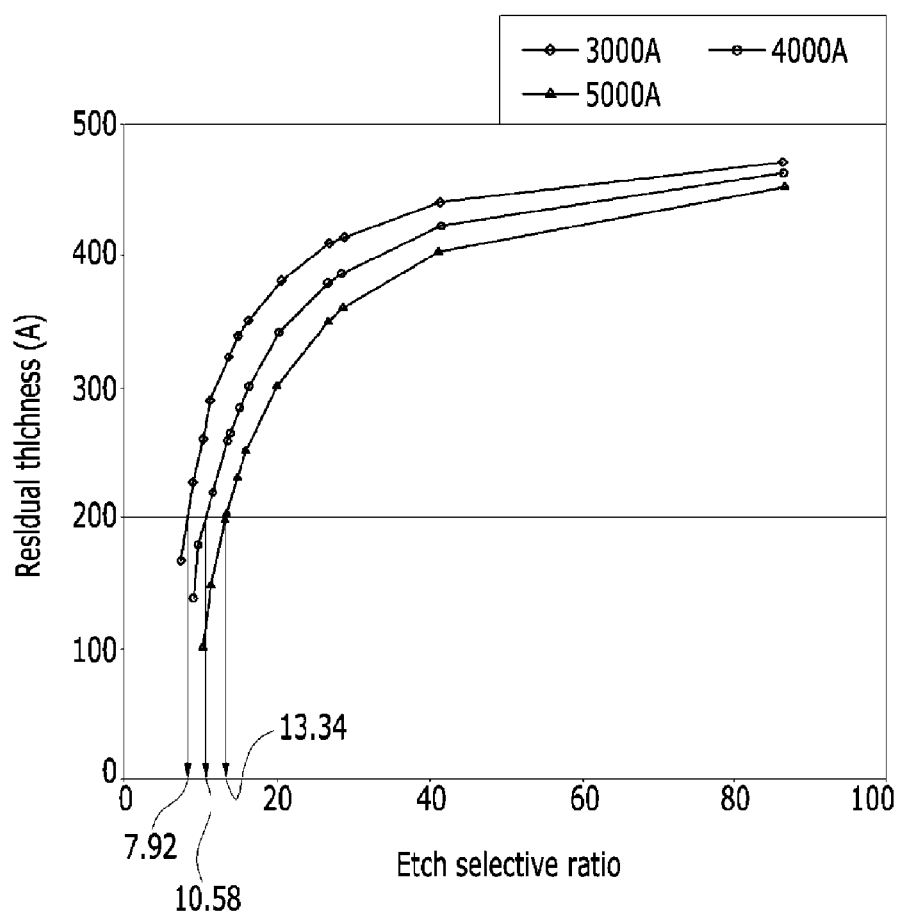
FIG. 8 is a graph illustrating an etch selective ratio of copper and a semiconductor for copper etchant according to thickness of a source electrode and a drain electrode and a residual thickness of a semiconductor layer.

FIG. 8 is a graph illustrating an etch selective ratio of copper and the semiconductor for a copper etchant according to thickness of the source electrode and the drain electrode and a residual thickness of the semiconductor layer.

Figure 9:
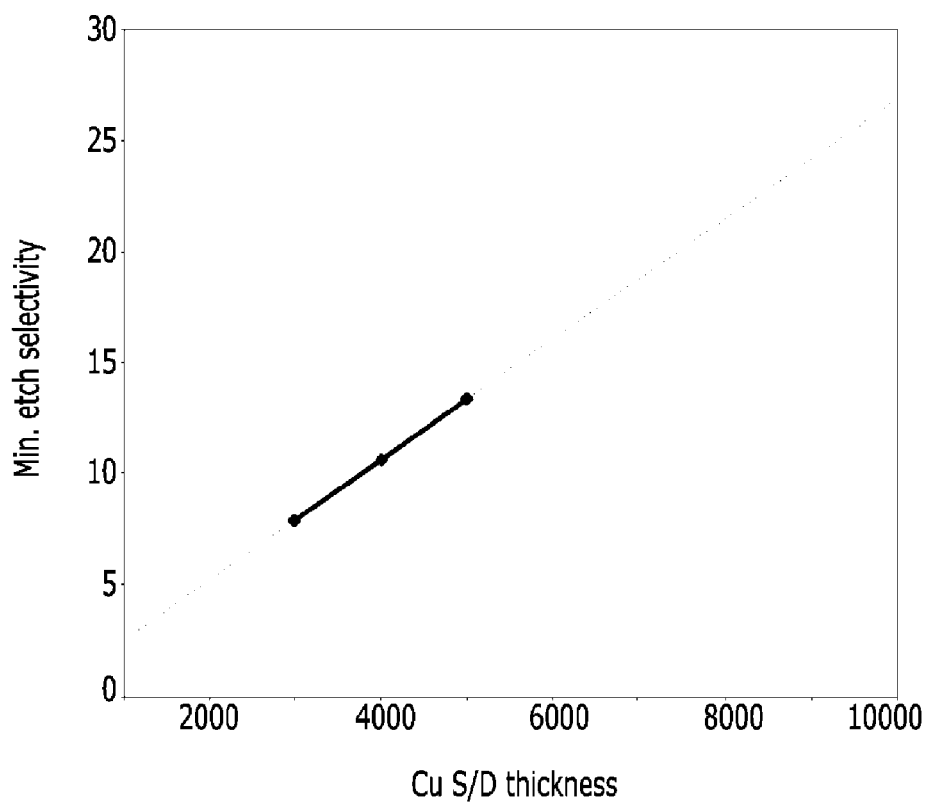
FIG. 9 is a graph illustrating a relation of a minimum etch selective ratio according to a thickness of a copper based metal layer based on the data shown in the graph of FIG. 8.

FIG. 9 is a graph illustrating a relation of a minimum etch selective ratio according to a thickness of the copper based metal layer, based on the data shown in the graph of FIG. 8.

Since electrical characteristics of the thin film transistor are decreased when the thickness of the semiconductor layer is thinner than about 200 Å, the thickness of the semiconductor layer is maintained to be equal to or thicker than about 200 Å when the source electrode and the drain electrode are formed by etching the copper based metal layer.

The source electrode and the drain electrode are formed by depositing a copper based metal layer such as copper, copper alloy or the like on the semiconductor layer, and then etching the copper based metal layer by using a copper etchant.

Three types of experiments with a copper based metal layer having thicknesses of 3000 Å, 4000 Å and 5000 Å were performed, and an experiment with a semiconductor layer having a thickness of 500 Å was also performed.

As illustrated in FIG. 8, in a case where the thickness of the copper based metal layer is 3000 Å and when the residual thickness of the semiconductor layer is 200 Å, an etch selective ratio is 7.92. In a case where the thickness of the copper based metal layer is 4000 Å and when the residual thickness of the semiconductor layer is 200 Å, the etch selective ratio is 10.58. In a case where the thickness of the copper based metal layer is 5000 Å and when the residual thickness of the semiconductor layer is 200 Å, the etch selective ratio is 13.34.

Accordingly, as illustrated in FIG. 9 and based on the data shown in FIG. 8, a minimum etch selective ratio according to the thickness of the copper based metal layer satisfies the following equation:

$$-0.22+0.002\times\text{thickness of copper based metal layer}$$

Figure 10:
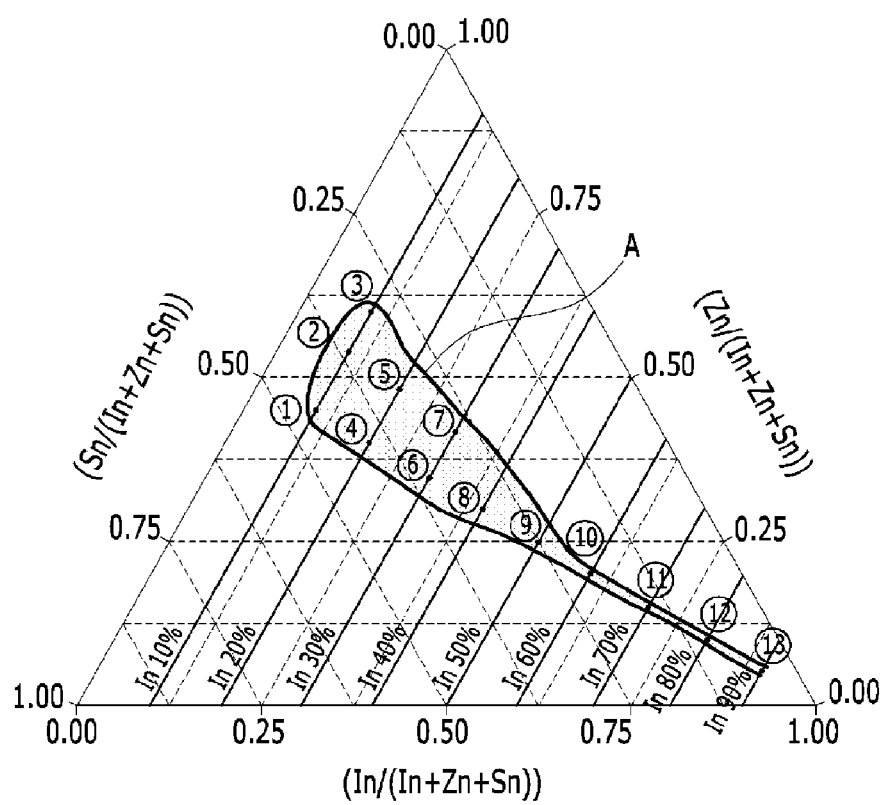
FIG. 10 is a graph illustrating ratios of indium, tin, and zinc according to a range from an upper limit to a lower limit of an etching rate for copper etchant.

FIG. 10 is a graph illustrating ratios of indium, zinc, and tin according to a range from an upper limit to a lower limit of an etching rate for a copper etchant. Table 1 includes data showing ratios of indium, zinc, and tin of a semiconductor layer having a thickness of 200 Å or more in the graph of FIG. 10. The data showing ratios of indium, zinc, and tin in table 1 corresponds to ① to ⑬ marked in FIG. 10, respectively.

Referring to FIG. 10, it can be identified that the thickness of the semiconductor layer is equal to or thicker than 200 Å in a region A.

TABLE 1

| No. | In (at %) | Zn (at %) | Sn (at %) |
|---|---|---|---|
| 1 | 10 | 45 | 45 |
| 2 | 10 | 54 | 36 |
| 3 | 10 | 60 | 30 |
| 4 | 20 | 40 | 40 |
| 5 | 20 | 48 | 32 |
| 6 | 30 | 35 | 35 |
| 7 | 30 | 42 | 28 |
| 8 | 40 | 30 | 30 |
| 9 | 50 | 25 | 25 |
| 10 | 60 | 20 | 20 |
| 11 | 70 | 15 | 15 |
| 12 | 80 | 10 | 10 |
| 13 | 90 | 5 | 5 |

A thin film transistor and a liquid crystal display according to another exemplary embodiment of the present invention will now be described with reference to FIGS. 11 to 13.

Figure 11:
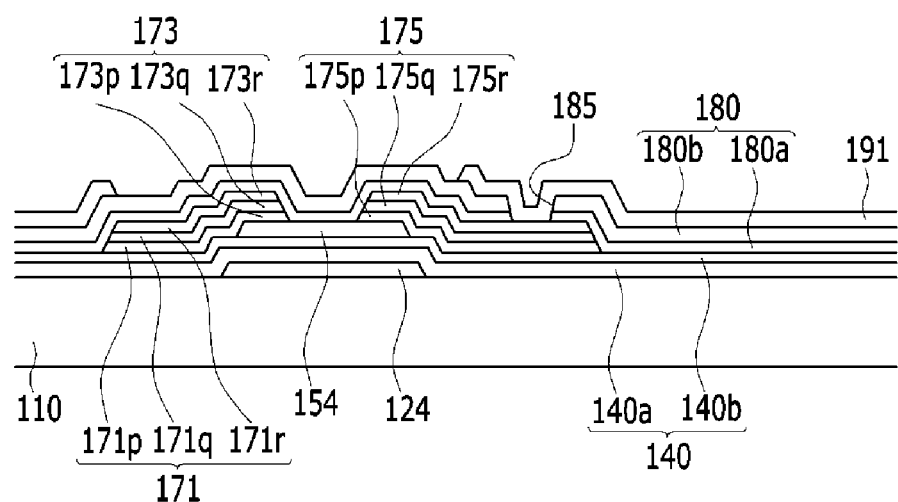
FIG. 11 is a cross-sectional view illustrating a thin film transistor display panel according to another exemplary embodiment of the present invention.
Figure 12:
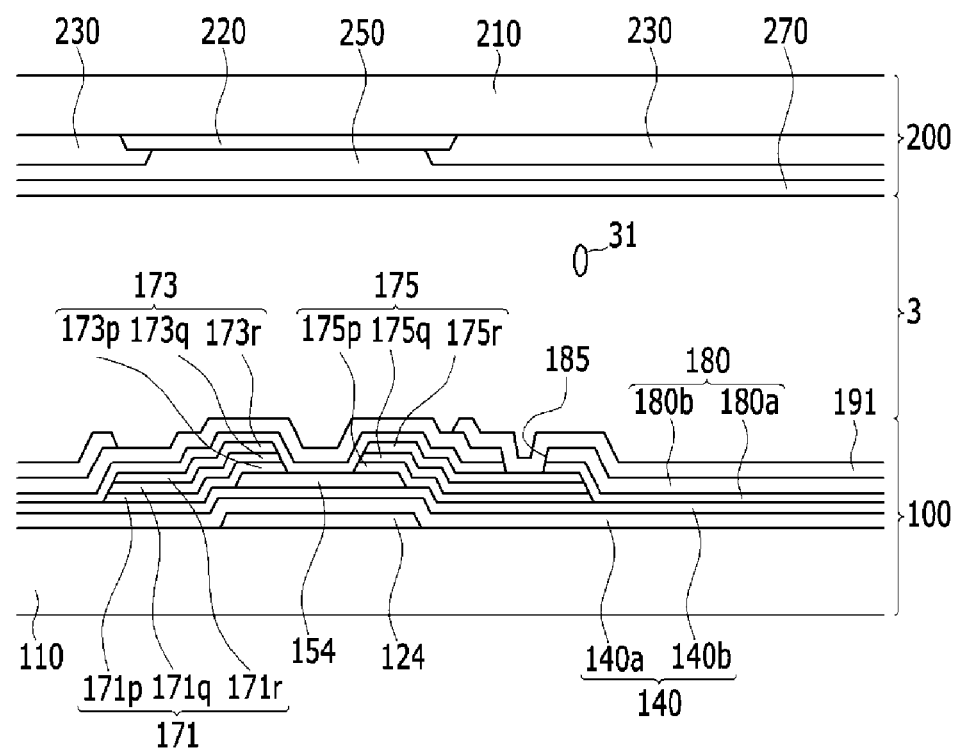
FIG. 12 is a cross-sectional view illustrating a liquid crystal display according to another exemplary embodiment of the present invention.

FIG. 11 is a cross-sectional view illustrating a thin film transistor display panel according to another exemplary embodiment of the present invention, and FIG. 12 is a cross-sectional view illustrating a liquid crystal display according to the exemplary embodiment of FIG. 11.

As illustrated in FIGS. 11 and 12, the thin film transistor display panel and the liquid crystal display according to FIGS. 11 and 12 are different from the thin film transistor display panel and the liquid crystal display according to FIGS. 2 and 3 in that the data line 171 including the source electrode 173 and the drain electrode 175 have a triple-layer structure and accordingly, contents of materials constituting the semiconductor layer 154 are different. Remaining configurations are the same.

Accordingly, only configurations of the data line 171 including the source electrode 173 and the drain electrode 175 corresponding to the different configurations and the contents of the materials constituting the semiconductor layer 154 will be described.

The semiconductor layer 154 is made of an oxide semiconductor, and the oxide semiconductor includes indium, zinc and tin. An atomic percent of indium in the oxide semiconductor is equal to or larger than about 10 at % and equal to or smaller than about 80 at %, an atomic percent of zinc is equal to or larger than about 10 at % and equal to or smaller than about 70 at %, and an atomic percent of tin is equal to or larger than about 5 at % and equal to or smaller than about 45 at %
.

Further, resistivity of the oxide semiconductor according to the present exemplary embodiment is equal to or smaller than about $5 \times 10^{-2}[\Omega cm]$. The resistivity corresponds to a range for applying an oxide semiconductor target including indium, zinc, and tin using an AC sputter or a DC sputter from a viewpoint of mass production.

The data line 171 and the drain electrode 175 have the triple-layer structure including lower layers 171p, 173p, and 175p, intermediate layers 171q, 173q, and 175q and upper layers 171r, 173r, and 175r.

The lower layers 171p, 173p, and 175p are made of molybdenum based metals such as pure molybdenum or molybdenum alloys including molybdenum nitride (MoN), molybdenum-niobium (MoNb), molybdenum-vanadium (MoV), molybdenum-titanium (MoTi), molybdenum-tungsten (MoW). The intermediate layers 171q, 173q, and 175q are made of an aluminum based metal such as aluminum having low resistivity or aluminum-neodymium (AlNd). The upper layers 171r, 173r, and 175r are made of molybdenum based metals such as pure molybdenum having excellent contact characteristics with ITO or IZO or molybdenum alloys including molybdenum nitride (MoN), molybdenum-niobium (MoNb), molybdenum-vanadium (MoV), molybdenum-titanium (MoTi), molybdenum-tungsten (MoW).

Here, the semiconductor layer 154 is formed by forming the semiconductor material on the gate insulating layer 140 and then etching the semiconductor material similarly as the method of manufacturing the thin film transistor display panel for the display device according to FIGS. 4 to 7. At this time, wet etching using a copper etchant is implemented.

Meanwhile, the data line 171 and the drain electrode 175 are formed using combination etchant, unlike the method of manufacturing the thin film transistor display panel for the display device according to FIGS. 4 to 7.

The data line 171 including the source electrode 173 and the drain electrode 175 are formed by sequentially depositing lower, intermediate, and upper metal layers on the semiconductor 154 and the gate insulating layer 140, and then etching the lower metal layer, the intermediate metal layer, and the upper metal layer by using a combination etchant. The lower metal layer is made of molybdenum based metals such as pure molybdenum or molybdenum alloys including molybdenum nitride (MoN), molybdenum-niobium (MoNb), molybdenum-vanadium (MoV), molybdenum-titanium (MoTi), and molybdenum-tungsten (MoW). The intermediate metal layer is made of the aluminum based metal such as aluminum or aluminum-neodymium (AlNd), and the upper metal layer is made of molybdenum based metals such as pure molybdenum or molybdenum alloys including molybdenum nitride (MoN), molybdenum-niobium (MoNb), molybdenum-vanadium (MoV), molybdenum-titanium (MoTi), molybdenum-tungsten (MoW). The combination etchant can etch all the molybdenum based metals and the aluminum based metals.

Here, an atomic percent of indium constituting the oxide semiconductor of the semiconductor layer 154 according to the present exemplary embodiment is equal to or larger than about 10 at % and equal to or smaller than about 80 at %, an atomic percent of zinc is equal to or larger than 10 at % and equal to or smaller than about 70 at %, and an atomic percent of tin is equal to or larger than 5 at % and equal to or smaller than about 45 at %, which are different the atomic percents of indium, zinc, and tin constituting the oxide semiconductor of the semiconductor layer 154 according to the thin film transistor display panel and the liquid crystal display of FIGS. 2 and 3.

Since the data line 171 and the drain electrode 175 are etched using a combination etchant instead of a copper etchant in the present exemplary embodiment, the atomic percents of indium, zinc, and tin of the semiconductor layer 154 according to the present disclosure correspond to contents for allowing the thickness of the semiconductor layer 154 of the channel part of the thin film transistor to be about 200 Å or more when the lower metal layer, the intermediate metal layer, and the upper metal layer are etched using the combination etchant.

Hereinafter, the semiconductor layer according to the present exemplary embodiment will be described in further detail.

Figure 13:
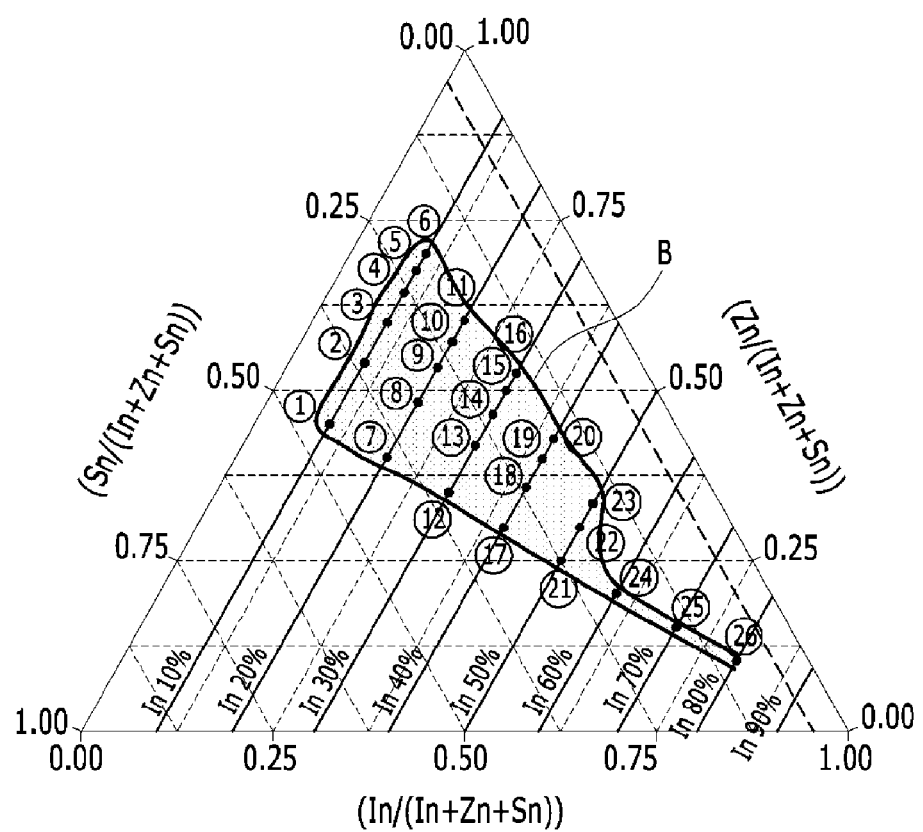
FIG. 13 is a graph illustrating ratios of indium, tin, and zinc according to a range from an upper limit and a lower limit of an etching rate for combination etchant.

FIG. 13 is a graph illustrating ratios of indium, tin, and zinc according to a range from an upper limit to a lower limit of an etching rate for the combination etchant. Table 2 includes data showing ratios of indium, tin, and zinc of the semiconductor layer having a thickness of 200 Å or more in the graph of FIG. 13. The data showing the ratios of indium, tin, and zinc in table 2 corresponds to ① to ㉖ marked in FIG. 13, respectively.

Referring to FIG. 13, it can be identified that the thickness of the semiconductor layer is 200 Å or more in region B.

TABLE 2

| No. | In (at %) | Zn (at %) | Sn (at %) |
|-----|-----------|-----------|-----------|
| 1   | 10        | 45        | 45        |
| 2   | 10        | 54        | 36        |
| 3   | 10        | 60        | 30        |
| 4   | 10        | 64.29     | 25.71     |
| 5   | 10        | 67.5      | 22.5      |
| 6   | 10        | 70        | 20        |
| 7   | 20        | 40        | 40        |
| 8   | 20        | 48        | 32        |
| 9   | 20        | 53.33     | 26.67     |
| 10  | 20        | 57.14     | 22.86     |
| 11  | 20        | 60        | 20        |
| 12  | 30        | 35        | 35        |
| 13  | 30        | 42        | 28        |
| 14  | 30        | 46.67     | 23.33     |
| 15  | 30        | 50        | 20        |
| 16  | 30        | 52.5      | 17.5      |
| 17  | 40        | 30        | 30        |
| 18  | 40        | 36        | 24        |
| 19  | 40        | 40        | 20        |
| 20  | 40        | 42.86     | 17.14     |
| 21  | 50        | 25        | 25        |
| 22  | 50        | 30        | 20        |
| 23  | 50        | 33.33     | 16.67     |
| 24  | 60        | 20        | 20        |
| 25  | 70        | 15        | 15        |
| 26  | 80        | 10        | 10        |

Although it has been described that the thin film transistor display panel according to the present exemplary embodiment is applied to liquid crystal displays, the present exemplary embodiment may also be applied to an organic light emitting device and other display devices for performing a switching operation by using the thin film transistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 110: First substrate | 124: Gate electrode |
| 140: Gate insulating layer | 154: Semiconductor layer |
| 171: Data line | 175: Drain electrode |
| 180: Passivation layer | 191: Pixel electrode |

What is claimed is:

1. A display device comprising:
a first substrate;
a gate line disposed on the first substrate and including a gate electrode;
a gate insulating layer disposed on the gate line;
a semiconductor layer disposed on the gate insulating layer;
a data line disposed on the semiconductor layer and including a source electrode;
a drain electrode disposed on the semiconductor layer and facing the source electrode; and
a passivation layer disposed on the data line and the drain electrode,
wherein the semiconductor layer comprises an oxide semiconductor including indium, tin, and zinc,
wherein an atomic percent of the indium in the oxide semiconductor is equal to or larger than about 10 at % and equal to or smaller than about 90 at %, an atomic percent of the zinc in the oxide semiconductor is equal to or larger than about 5 at % and equal to or smaller than about 60 at %, and an atomic percent of the tin in the oxide semiconductor is equal to or larger than about 5 at % and equal to or smaller than about 45 at %,
wherein a minimum etch selective ratio between the oxide semiconductor, and the data line and the drain electrode satisfies:

$$-0.22 + 0.002 \times T,$$

where T denotes a thickness of the data line and the drain electrode, and
wherein the data line and the drain electrode comprise copper.

2. The display device of claim 1, wherein the gate insulating layer includes a first insulating layer and a second insulating layer disposed on the first insulating layer,
the first insulating layer includes silicon nitride, and
the second insulating layer includes silicon oxide.

3. The display device of claim 2, wherein the passivation layer includes a first passivation layer and a second passivation layer disposed on the first passivation layer,
the first passivation layer includes silicon oxide, and
the second passivation layer includes silicon nitride.

4. The display device of claim 3, further comprising a pixel electrode disposed on the passivation layer,
wherein the passivation layer has a contact hole, and the pixel electrode and the drain electrode are connected through the contact hole.

5. The display device of claim 4, further comprising a second substrate facing the first substrate,
wherein a liquid crystal layer is interposed between the first substrate and the second substrate.

6. A display device comprising:
a first substrate;
a gate line disposed on the first substrate and including a gate electrode;
a gate insulating layer disposed on the gate line;
a semiconductor layer disposed on the gate insulating layer;
a data line disposed on the semiconductor layer and including a source electrode;
a drain electrode disposed on the semiconductor layer and facing the source electrode; and
a passivation layer disposed on the data line and the drain electrode,
wherein the semiconductor layer comprises an oxide semiconductor including indium, tin, and zinc,
wherein an atomic percent of the indium in the oxide semiconductor is equal to or larger than about 10 at % and equal to or smaller than about 80 at %, an atomic percent of the zinc in the oxide semiconductor is equal to or larger than about 10 at % and equal to or smaller than about 70 at %, and an atomic percent of the tin in the oxide semiconductor is equal to or larger than about 5 at % and equal to or smaller than about 45 at %, and
wherein the data line and the drain electrode include a lower layer and an upper layer comprising molybdenum, and an intermediate layer comprising aluminum, the intermediate layer being disposed between the lower layer and the upper layer.

7. The display device of claim 6, wherein the gate insulating layer includes a first insulating layer and a second insulating layer disposed on the first insulating layer, the first insulating layer includes silicon nitride, and
the second insulating layer includes silicon oxide.

8. The display device of claim 7, wherein the passivation layer includes a first passivation layer and a second passivation layer disposed on the first passivation layer,
the first passivation layer includes silicon oxide, and
the second passivation layer includes silicon nitride.

9. The display device of claim 8, further comprising a pixel electrode disposed on the passivation layer,
wherein the passivation layer has a contact hole, and the pixel electrode and the drain electrode are connected through the contact hole.

10. The display device of claim 9, further comprising a second substrate facing the first substrate,
wherein a liquid crystal layer is interposed between the first substrate and the second substrate.

11. A method of manufacturing a display device, the method comprising:
forming a gate line on a first substrate, the gate line including a gate electrode;
forming a gate insulating layer on the gate line;
forming a semiconductor layer by depositing an oxide semiconductor material including indium, tin, and zinc on the gate insulating layer, and then etching the oxide semiconductor material with a first etchant;
forming a data line including a source electrode and a drain electrode facing the source electrode, by forming a metal layer on the semiconductor layer and then etching the metal layer with a second etchant, the metal layer including copper; and
forming a passivation layer on the data line and the drain electrode;
wherein an atomic percent of the indium in the oxide semiconductor material is equal to or larger than about 10 at % and equal to or smaller than about 90 at %, an atomic percent of the zinc in the oxide semiconductor is equal to or larger than about 5 at % and equal to or smaller than about 60 at %, and an atomic percent of the tin in the oxide semiconductor is equal to or larger than about 5 at % and equal to or smaller than about 45 at %; and
wherein a minimum etch selective ratio between the oxide semiconductor material and the metal layer satisfies:

$$-0.22 + 0.002 \times T,$$

where T denotes a thickness of the metal layer.

12. The method of claim 11, wherein the first etchant and the second etchant are copper etchants.

13. The method of claim 11, wherein the first etchant is a copper etchant, and the second etchant is a combination etchant.

14. The method of claim 13, wherein the metal layer includes a lower layer, an upper layer that comprises molybdenum, and an intermediate layer comprising aluminum, the intermediate layer being disposed between the lower layer and the upper layer.

15. The method of claim 11, wherein the gate insulating layer includes a first insulating layer and a second insulating layer disposed on the first insulating layer,
the first insulating layer includes silicon nitride, and
the second insulating layer includes silicon oxide.

16. The method of claim 15, wherein the passivation layer includes a first passivation layer and a second passivation layer disposed on the first passivation layer,
the first passivation layer includes silicon oxide, and
the second passivation layer includes silicon nitride.

17. The method of claim 16, further comprising forming a pixel electrode on the passivation layer,
wherein the passivation layer has a contact hole, and the pixel electrode and the drain electrode are connected through the contact hole.

* * * * *